METHOD OF PRODUCING SEMICONDUCTOR DEVICES

Filed April 1, 1966 4 Sheets-Sheet 1

INVENTORS.
BRIAN DALE and
ROBERT C. INGRAHAM

BY David M. Keay

AGENT.

INVENTORS.
BRIAN DALE and
ROBERT C. INGRAHAM

BY David M. Keay
AGENT.

INVENTORS.
BRIAN DALE and
ROBERT C. INGRAHAM

BY David M. Keay

AGENT.

METHOD OF PRODUCING SEMICONDUCTOR DEVICES

Filed April 1, 1966 4 Sheets-Sheet 4

INVENTORS.
BRIAN DALE and
ROBERT C. INGRAHAM

BY David M. Keay

AGENT.

United States Patent Office 3,387,359

Patented June 11, 1968

3,387,359
METHOD OF PRODUCING SEMICONDUCTOR DEVICES

Brian Dale, West Peabody, and Robert C. Ingraham, Topsfield, Mass., assignors to Sylvania Electric Products Inc., a corporation of Delaware Filed Apr. 1, 1966, Ser. No. 539,444
13 Claims. (Cl. 29—577)

Figure 1:
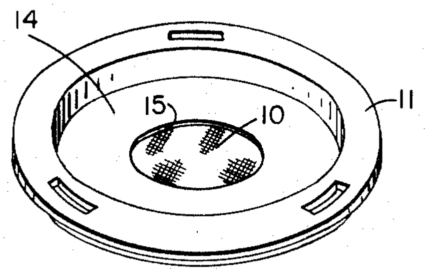

This invention relates to electrical translating devices. More particularly, it is concerned with improved methods for fabricating semiconducting devices.

Present techniques of diffusing conductivity type imparting materials through small precisely defined openings in protective coatings on bodies of semiconductor material have made possible the fabrication of semiconductor devices such as diodes, transistors, and integrated circuit networks of exceptionally small size. By employing these processing techniques the electrically active regions of a large number of devices are fabricated simultaneously in a single wafer of semiconductor material. Because the active regions of each device are small and are batch produced in quantity in a single wafer, unit costs of material, processing, and handling are low.

After the formation of the electrically active regions in a wafer of semiconductor material, the wafer is divided into individual dice each containing the electrically active regions of a semiconductor device. Each die is mounted in a suitable enclosure which protects the die and permits electrical connection to be made to the electrically active regions by lead wires passing to the exterior of the enclosure and connected to the active regions within the enclosure.

The enclosure commonly includes a header which supports the lead wires in electrically insulated relationship with each other. A die is mounted on the header and appropriate electrical connections are made between the active regions of the die and the lead wires. Typically the electrical connections are made by thermal compression bonding fine connecting wires to metallized bonding pads on the semiconductor die which contact the electrically active regions and to the appropriate leads. The die, connecting wires, and portions of the lead wires are then covered by a cap which is sealed to the header or are encapsulated in plastic.

Many production problems are encountered in mounting semiconductor dice and connecting them to lead wires. The semiconductor dice are difficult to handle because of their extremely small size. Every operation performed on a die including the step of positioning it in proper orientation requires observation of the die through a microscope. The headers on which the dice are to be mounted are discrete units which must be handled and appropriately oriented in order that the dice can be properly mounted and connected. Manipulating the fine connecting wire and aligning the wire and the thermal compression bonding tools with respect to a semiconductor die is a critical, exacting procedure fraught with annoying difficulties.

These time-consuming operations are not performed on a multitude of units in a batch, but are performed manually on each individual unit in succession. Therefore, the portion of the cost of a completed semiconductor device represented by the cost of mounting and connecting the semiconductor die to a header may represent a substantial portion of the cost of producing the device.

It is an object of the present invention, therefore, to provide an improved method for producing semiconductor devices.

It is a more specific object of the invention to provide an improved method of attaching semiconductor elements containing the electrically active regions of semiconductor devices to headers and making electrical connections thereto which method reduces the problems of handling, orienting, and manipulating parts and apparatus and is amenable to automatic or semi-automatic operation.

In accordance with the method of the invention an array of semiconductor elements is provided. Each semiconductor element of the array includes a body of semiconductor material and conductive relative rigid members or "beams" projecting beyond the edges of the body. Some of these "beams" make electrical contact to active regions in the body of semiconductor material. One of the supporting beams of each semiconductor element is fixed to a supporting grid to position and support the semiconductor elements in a predetermined pattern.

An array of mounting headers comprising a member of nonconductive material having a plurality of groups of conductive regions thereon is also provided. Each group of conductive regions is arranged to provide conductive paths for a semiconductor element, and the groups of conductive regions are positioned on the member of nonconductive material in a predetermined pattern.

The array of mounting headers is moved to position one of the groups of conductive regions at a bonding location with the conductive regions of the group oriented in a predetermined manner. The array of semiconductor elements is also moved in order to position one of the semiconductor elements at a transfer location with the supporting beams oriented in a predetermined manner.

The semiconductor element at the transfer location is moved with respect to the group of conductive regions at the bonding location to place the supporting beams of the semiconductor element in contact with conductive regions of the group. Then, the supporting beams of the semiconductor element are bonded to the contacted conductive regions of the group.

The steps of moving the array of mounting headers to position a group of conductive regions at the bonding location, moving the array of semiconductor elements to position a semiconductor element at the transfer location, then moving the semiconductor element at the transfer location to place the supporting beams of the element in contact with conductive regions of the group at the bonding location, and bonding the supporting beams of the semiconductor element to the contacted conductive regions are continued to produce an array of mounted semiconductor elements arranged in a predetermined pattern.

Figure 2:
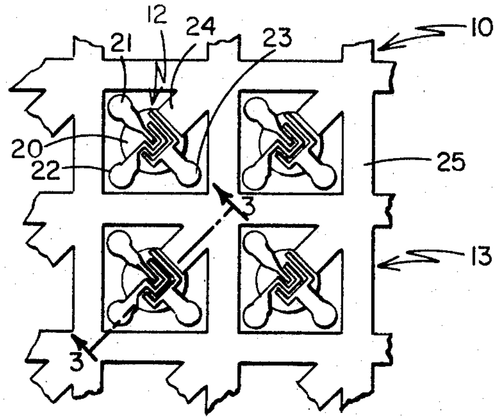
Figure 3:
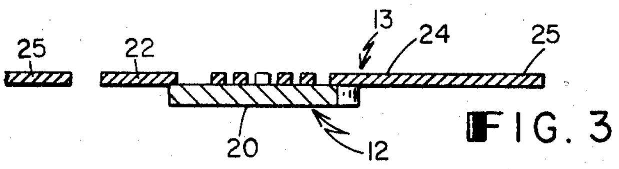
Figure 4:
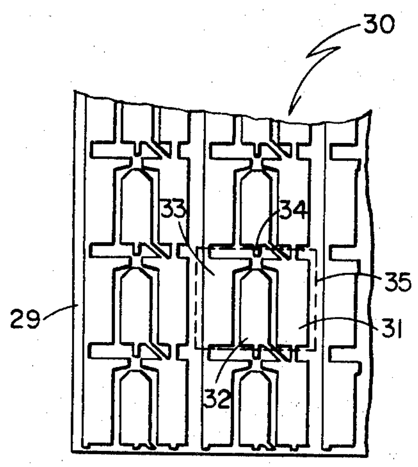
Figure 5:
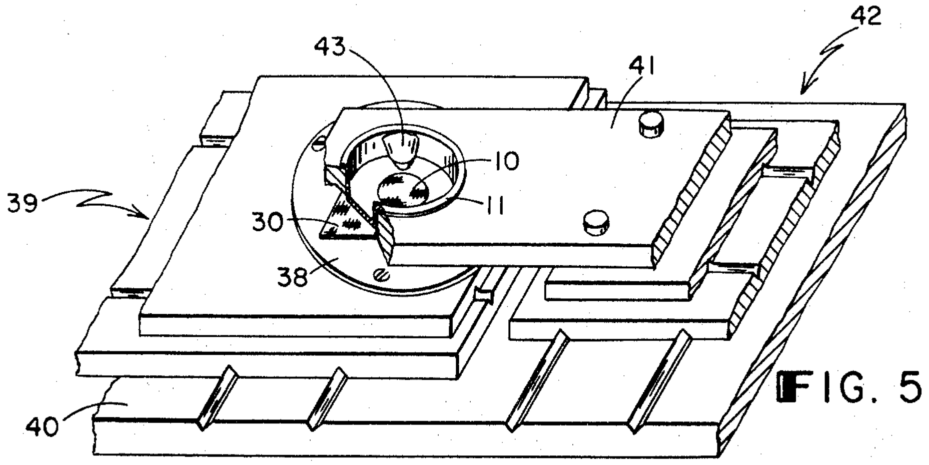
Figure 6:
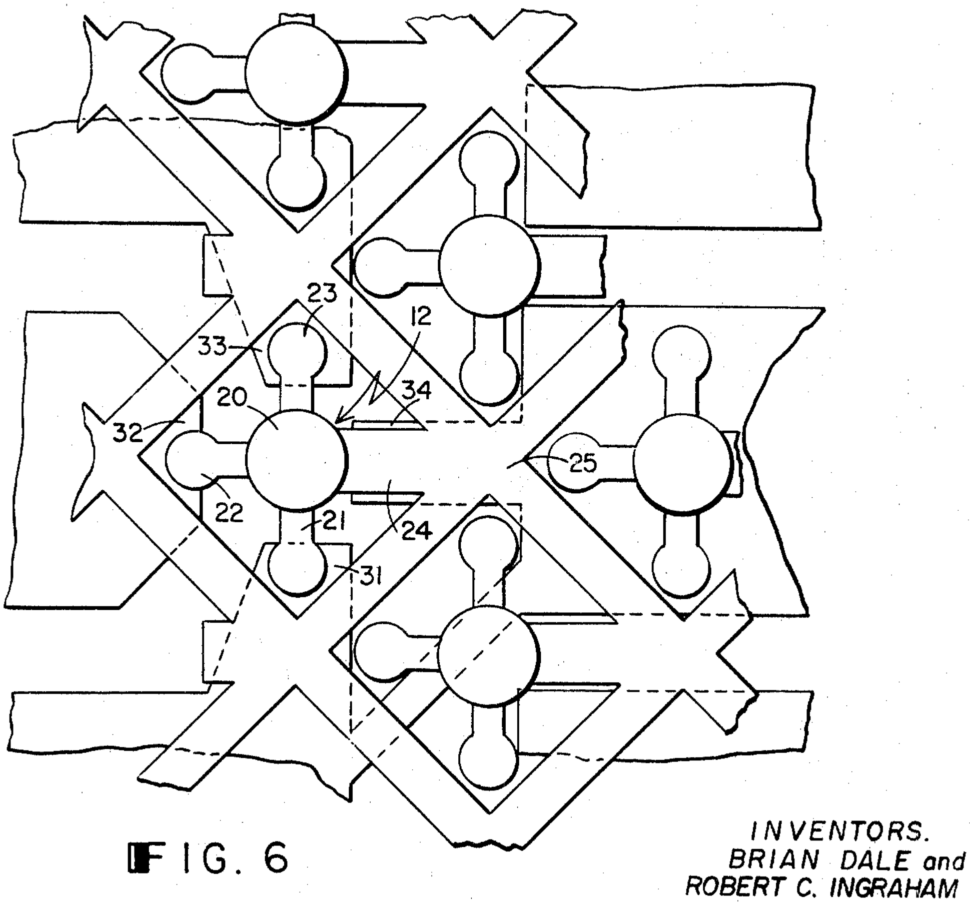
Figures 7, 8, 9:
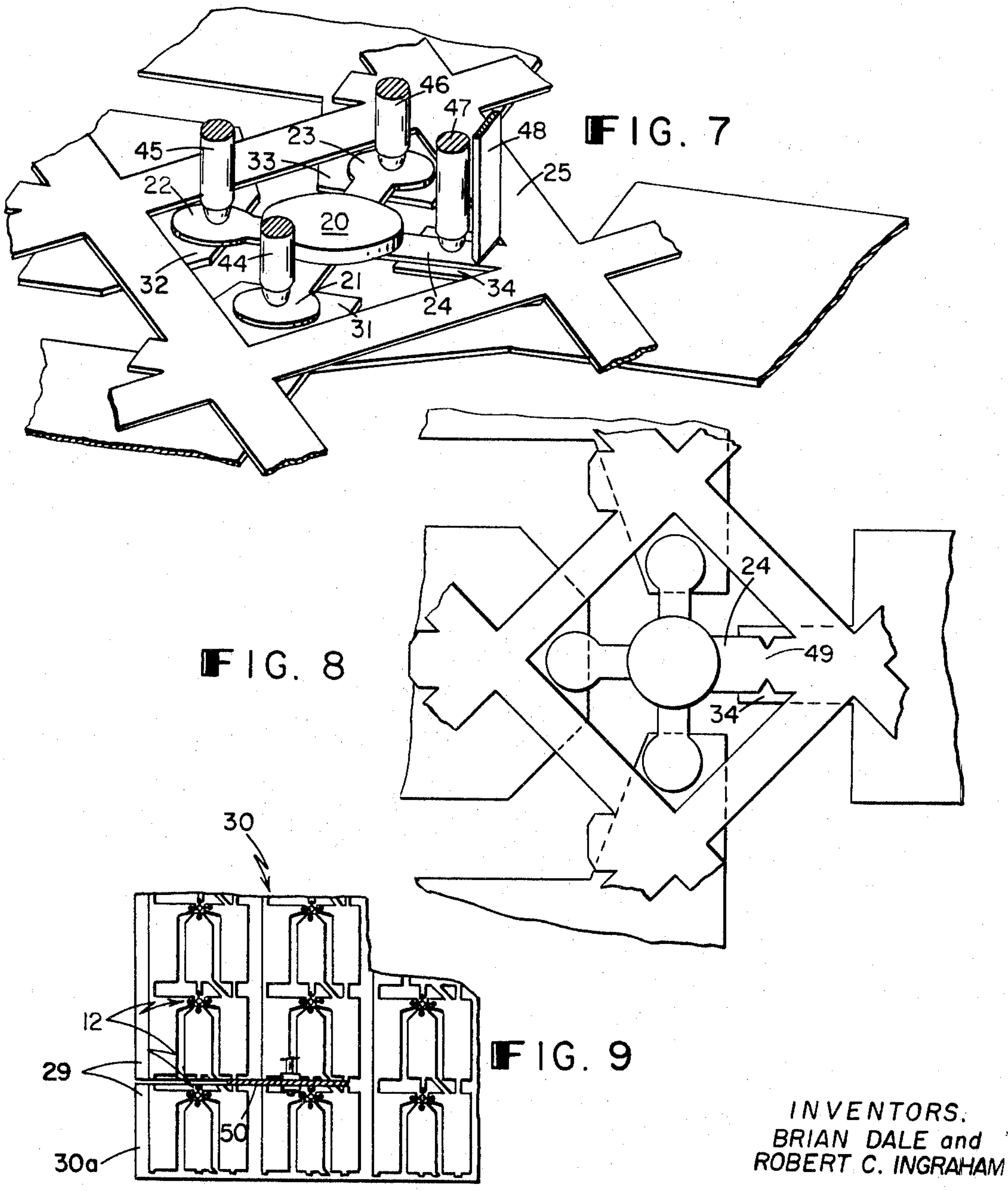
Figures 10, 11:
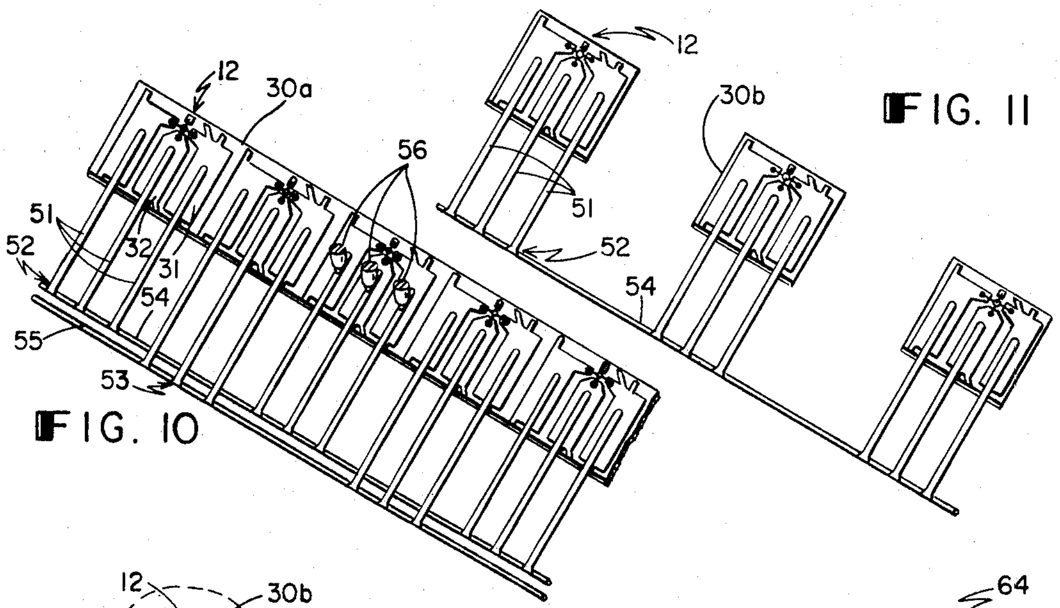
Figure 12:
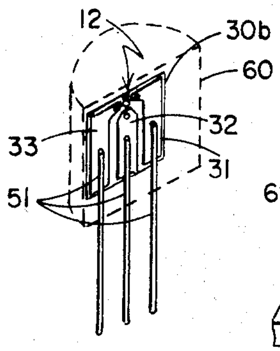
Figure 13:
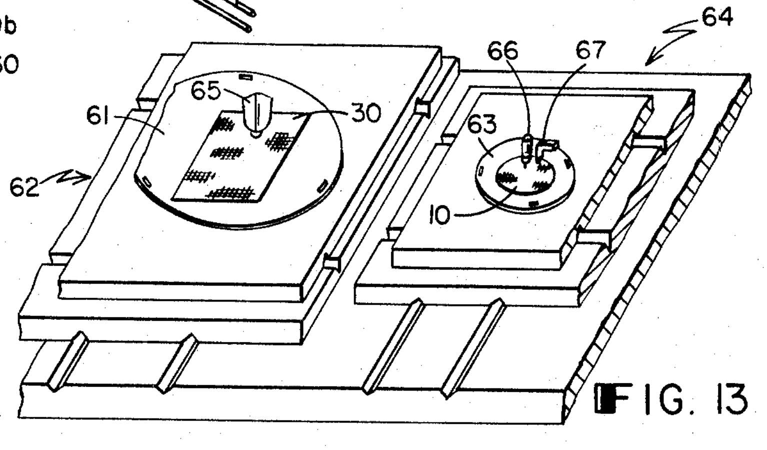
Figures 14, 15:
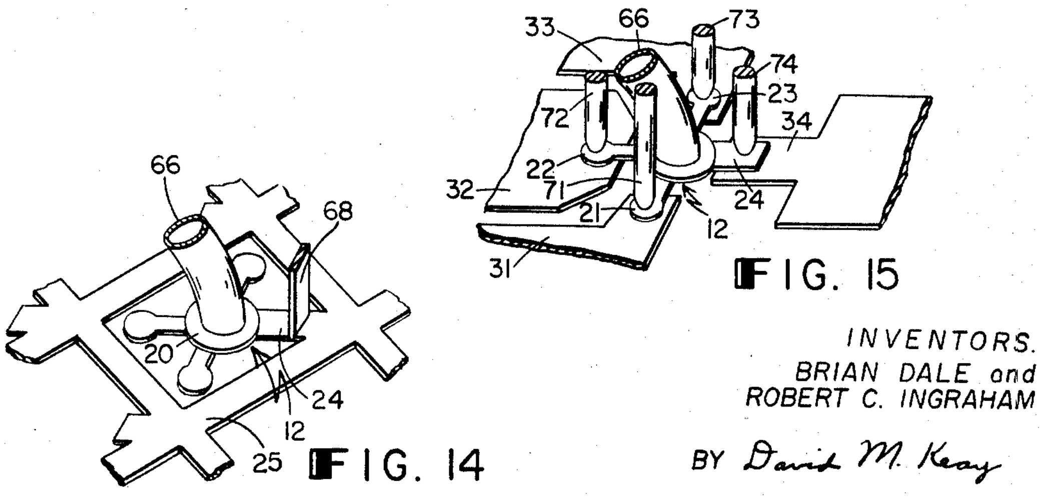

Additional objects, features, and advantages of the foregoing method of fabricating semiconductor devices will be apparent from the following detailed discussion and the accompanying drawings wherein:

FIG. 1 is a perspective view of an array of semiconductor elements mounted on a supporting ring, FIG. 2 is a view of a fragment of the array of semiconductor elements of FIG. 1 as seen from beneath the supporting ring illustrating the configuration of individual semiconductor dice together with the supporting beams and supporting grid structure, FIG. 3 is a cross-sectional view of a semiconductor element and adjacent portions of the supporting grid taken along line 3—3 of FIG. 2, FIG. 4 is a plan view of a fragment of an array of mounting headers showing several groups of conductive regions to which semiconductor elements of the array are to be attached, FIG. 5 is a representation in perspective of moveable supports and a tool column for successively aligning semiconductor elements of the array above mounting headers of the array and for bonding the aligned semiconductor element to conductive regions of the mounting header, FIG. 6 is a plan view of fragments of the arrays showing a semiconductor element aligned in position for bonding above the group of conductive regions of a mounting header, FIG. 7 is a perspective view illustrating the semiconductor element superimposed on the group of conductive regions and being bonded thereto, FIG. 8 is a plan view illustrating an alternative arrangement for holding semiconductor elements to the supporting grid in order to simplify removal of the elements from the array, FIG. 9 is a plan view illustrating the step of cutting the array of mounting headers into strips of mounting headers subsequent to the mounting of semiconductor elements at each of the groups of conductive regions of the array, FIG. 10 is a perspective view of a strip of mounting headers illustrating the bonding of lead wires arranged in two combs to the conductive regions of the mounting headers, FIG. 11 is a plan view of every other mounting header of a strip of headers bonded to the lead wires of one comb to form a string of headers by cutting of the strip into individual headers, FIG. 12 is a perspective view of a completed semiconductor device with the outline of the solidified encapsulating material of the device enclosure indicated in phantom, FIG. 13 is a representation in perspective of moveable supports and tool supporting structures for use in transferring semiconductor elements from an array of elements and bonding them to the mounting headers of an array of headers in accordance with a modification of the invention, FIG. 14 is a perspective view illustrating the removal of a semiconductor element from the array of semiconductor elements, and FIG. 15 is a perspective view illustrating the semiconductor element transferred from the array of elements and being bonded to a mounting header of the array.

An array of semiconductor elements 10 mounted on a supporting ring 11 is illustrated in FIG. 1. Details of the array and of each semiconductor element 12 of the array are best seen in FIGS. 2 and 3.

The array of semiconductor elements is formed from a wafer of semiconductor material, for example, silicon. Conductivity type imparting materials are diffused into the wafer through openings in oxide coatings on the surface of the wafer to form diffused regions of opposite conductivity types. Each group of regions is the electrically active regions of a semiconductor device, and the groups are evenly distributed in a regular pattern over the surface of the wafer.

A network of conductive supporting leads or beams 13 is formed on the surface of the oxide coated semiconductor wafer in the pattern illustrated in FIG. 2. The adherent supporting beam network is produced on the wafer as by the method of forming connecting leads described and claimed in copending application Ser. No. 498,039, filed Oct. 19, 1965, by Allen G. Baker and Robert C. Ingraham entitled "Method of Producing Semiconductor Devices Having Connecting Leads Attached Thereto," and assigned to the assignee of the present invention.

Upon completion of the supporting beam network, the semiconductor material of the wafer is removed except for portions containing the active regions of semiconductor elements. This procedure may be accomplished by mounting the wafer to the underside of the bottom plate 14 of the supporting ring 11. The wafer is attached at the periphery of a central opening 15 in the plate 14 with the supporting beam network 13 downward. The wafer is appropriately masked to protect the portions containing the active regions, and immersed in a suitable etching solution which dissolves all the semiconductor material of the wafer except the protected portions.

The resulting array of semiconductor elements is best seen in FIGS. 2 and 3. Each semiconductor element 12 of the array includes a die 20 of semiconductor material having a group of diffused active regions. For illustrative purposes the dice shown have three diffused active regions enabling the element to function as a transistor. Supporting beams 21, 22, and 23 which adhere to the surface of each die and project from the die make contact through the oxide coating to underlying active regions thereby providing electrical connections to the emitter, base, and collector regions, respectively, of the element.

A fourth supporting beam 24 also adheres to the surface of the die but is not electrically connected to semiconductor material underlying the oxide coating. The fourth supporting beam 24 extends to a supporting grid 25 which is also part of the conductive supporting beam network 13, thereby holding the semiconductor element in position with respect to the supporting grid. The supporting grid 25 is comprised of two sets of parallel beams intersecting at right angles. A semiconductor die is located centrally of each opening formed by the intersecting sets of beams, producing a regular two-dimensional array of substantially identical semiconductor elements arranged in a square pattern of even rows and columns.

As a specific example, an array of semiconductor elements as shown in FIGS. 2 and 3 may include semiconductor dice 20 which are approximately 6 mils in diameter and 1½ mils thick. The supporting beams 21, 22, 23, and 24 and the grid structure 25 are about .4 mil thick and the grid beams are about 3 mils wide. The supporting beam network is of gold except for a thin layer at the surface contacting the wafer of semiconductor material. The semiconductor elements are spaced at 20 mil intervals in both directions.

A fragment of an array of mounting headers 30 is shown in FIG. 4. The array includes a flat plate or board 29 of non-conductive material having a plurality of groups of conductive regions 31, 32, 33, and 34 on one surface. The array may be produced as in the manner of fabricating circuit boards in which a clad metal layer, as of copper, on an insulating board is selectively removed to leave a desired pattern of conductive regions. The board is then suitable plated to provide a surface layer of gold on the conductive regions.

Each group of conductive regions together with the portion of the insulating board to which it adheres provides a mounting header, one of which is delineated by the dashed line 35 in FIG. 4. The configuration and spacing of the conductive regions of each group is such that they will accommodate the supporting beams of a semiconductor element and provide conductive paths for the element as will be explained hereinafter. As shown, the substantially identical groups of conductive regions are arranged on the insulating board to provide a regular two-dimensional array of mounting headers arranged in a square pattern of even rows and columns.

A representation of portions of apparatus for removing semiconductor elements from the array of semiconductor elements and bonding them to the mounting headers of the array of headers is illustrated in FIG. 5. The array of mounting headers 30 is mounted on a rotatable plate 38, which in turn is mounted on a lateral slider assembly 39. Thus, the array of headers may be rotated, to a limited extent, and moved laterally in any direction to orient the mounting headers and register them in a desired position with respect to a base member 40.

The supporting ring 11 holding the array of semiconductor elements 10 is rotatably mounted in an opening in an overhanging plate 41 so that the semiconductor elements are below the surface of the plate and are located above the array of mounting headers. The plate 41 is mounted on a lateral slider assembly 42 so as to permit limited vertical movement with respect to the assembly and the base member 40. Thus, the array of semiconductor elements may be rotated and moved laterally in any direction to orient the semiconductor elements and register them in a desired position with respect to the base member 40; and, in addition, the array may be moved vertically a limited distance with respect to the base member.

This arrangement permits any one of the semiconductor elements and any one of the mounting headers to be positioned directly beneath a vertically movable tool column 43. After the plate 38 has been rotated so as to properly orient the mounting headers, movement of the array through increments of a predetermined distance by means of the slider assembly 39 successively places the mounting headers in desired position beneath the tool column 43. Similarly, after the supporting ring 11 has been rotated so as to properly orient the semiconductor elements, movement of the plate 41 through increments of a predetermined distance by means of the slider assembly 42 successively places semiconductor elements in desired position beneath the tool column 43.

FIG. 6 illustrates registration of the array of semiconductor elements 10 with respect to the array of mounting headers 30 with the group of conductive regions 31, 32, 33, 34 of a mounting header positioned in bonding location beneath the tool column 43 and with a properly oriented semiconductor element 12 superimposed above the mounting header in position to be transferred into contact with the header for mounting thereon. Each of the projecting supporting beams 21, 22, and 23 connected to an active region of the semiconductor element is aligned with a mating portion of a different conductive region of the group of regions.

After the array of headers 30 and the array of semiconductor elements 10 have been moved horizontally to obtain proper alignment, the overhanging plate 41 is lowered to place the semiconductor element 12 in contact with the mounting header at the bonding location. Then, the tool column 43 is lowered pressing bonding tools 44, 45, 46, and 47 into contact with the projecting portions of the supporting beams 21, 22, 23, and 24, respectively, of the semiconductor element as illustrated in FIG. 7.

The bonding tools force the end portions of the supporting beams 21, 22, 23, and 24 against the mating portions of the conductive regions 31, 32, 33, and 34, respectively, and bond the beams to the respective regions as by ultrasonic welding. After the bonds have been made, the bonding tools are retracted and a cutting tool 48 is lowered to cut the fourth supporting beam 24 at a point between the supporting grid 25 and the bond, thus severing the bonded semiconductor element from the array.

The bonds may be made simultaneously or successively, and the supporting beams may be bonded to the conductive regions by bonding techniques other than ultrasonic welding. It is not essential that the fourth supporting beam 24 be bonded to a conductive region. Only supporting beams making contact to active regions of the semiconductor die need be connected to conductive regions. However, the connection between the fourth supporting beam 24 and the conductive region 34 provides additional mechanical strength to the assembly of the semiconductor element and mounting header.

If desired, one or more of the three electrically active supporting beams 21, 22, or 23 may also be fixed to the supporting grid 25 to provide two or more physical connections between the semiconductor element and the grid; or one or more of the electrically active supporting beams may be fixed to the supporting grid and the fourth electrically inactive supporting beam 24 eliminated. All of the supporting beams which are connected to the supporting grid must be cut in order to sever the bonded semiconductor element from the array.

FIG. 8 illustrates a different configuration of the fourth supporting beam 24 which permits an alternative procedure for severing the bonded semiconductor element from the array of semiconductor elements. The fourth supporting beam 24 has a necked-down section 49 of smaller cross-sectional area than the remainder of the beam, and is bonded to the appropriate conductive region 34 at a point between the necked-down section and the die. Movement of the array of semiconductor elements with respect to the array of mounting headers subsequent to the step of bonding all the supporting beams to their respective conductive regions causes the fourth supporting beam to rupture at the necked-down section thereby severing the bonded semiconductor element from the array. When employing this alternative procedure, it is particularly desirable that the fourth supporting beam 24 be bonded to the header in order to insure that the semiconductor element is not damaged and that the beam ruptures at the necked-down section.

After the bonding operaiton, the overhanging plate 41 is raised slightly. As explained previously, the fourth supporting beam 24 is either cut by a tool prior to moving the plate 41, or movement of the plate 41 breaks the beam at a necked-down section. The array of semiconductor elements 10 and the array of mounting headers 30 are each moved predetermined distances by indexing the slider assemblies 39 and 42. The array of mounting headers is moved so as to position a group of conductive regions at the bonding location and the array of semiconductor elements is moved so as to superimpose a semiconductor element over the conductive regions at the bonding location as illustrated in FIG. 6. The process of bonding the semiconductor element to the mounting header, separating the bonded semiconductor element from the array, and moving the arrays is repeated.

The foregoing procedure is repeated continually to produce an array of header mounted semiconductor elements as illustrated in FIG. 9. The insulating board 29 is then cut into strips 30*a* of mounting headers as by a saw 50 or a gang of saws. Each strip is a linear array of semiconductor elements mounted on headers and arranged in a regular predetermined pattern.

Lead wires 51 may then be attached to conductive regions 31, 32, and 33 of each mounting header as illustrated in FIG. 10. As shown in the drawing, the lead wires 51 are arranged in two separate combs 52 and 53 by virtue of being attached to one of two rods 54 and 55. The leads of one comb 52 are arranged to contact the conductive regions of alternate headers of the strip, and the leads of the other comb 53 are arranged to contact the conductive regions of the intervening headers. The leads are attached to the conductive regions as by welding tools 56.

After the lead wires 51 have been attached to the conductive regions of each mounting header of the strip, each header is severed from the strip by cutting through the insulating board between each group of conductive regions. Two strings of headers are obtained, one of which is shown in FIG. 11. The headers 30*b* of a string are supported in fixed relationship by the rod 54 of the comb 52 thereby permitting them to be handled and further processed together.

Each of the headers and its mounted semiconductor element is encapsulated in a suitable plastic material. Then the lead wires are severed from the rod of the comb to provide a completed discrete semiconductor device. FIG. 12 illustrates an individual header and semiconductor element as embedded in a solid plastic enclosure 60 indicated in phantom.

A completed device includes a single mounting header 30*b* from the array of headers having several separate conductive regions 31, 32, and 33 electrically insulated from each other. Portions of the conductive regions are connected electrically and mechanically to portions of the supporting beams of the semiconductor element 12 which are in electrical contact with active regions of the semiconductor die. The header and semiconductor element are completely embedded in the protective plastic enclosure 60. Lead wires 51 connected to conductive regions of the header extend through the encapsulating plastic to permit electrical connections to be made to the electrically active regions of the semiconductor die.

It may, of course, be desired to produce a semiconductor device having a different configuration from that illustrated in FIG. 12. The pattern of the conductive regions 31, 32, and 33 of each header could be such as to enable the lead wires to extend from the enclosure in a different arrangement. It is also possible to place a protective material over only the semi-conductor element and the immediately adjacent portions of the header and employ the conductive regions as the external leads of the active regions of the device.

An alternative method of bonding semiconductor elements of an array to mounting headers of an array is illustrated in FIGS. 13, 14, and 15. The array of mounting headers 30 is mounted on a plate 61 which is rotatably mounted on a lateral slider assembly 62. The array of semiconductor elements 10 is similarly mounted on a plate 63 which is rotatably mounted on a lateral slider assembly 64. The array of semiconductor elements is attached to the plate 63 by bonding at the outer edge of the array.

After the array of headers has been properly positioned and oriented, the slider assembly 62 may be continually indexed through increments of a predetermined distance to place each mounting header in succession in a bonding location directly beneath a tool column 65. Similarly, after the array of semiconductor elements has been properly positioned and oriented, the slider assembly 64 may be continually indexed to place each semiconductor element in succession at a transfer location beneath a vacuum pick-up tool 66 and a tool column 67.

When a semiconductor element 12 has been placed in the transfer location, the pick-up tool 66 is lowered into contact with the semiconductor die 20 of the element as illustrated in FIG. 14. While the tip of the pick-up tool 66 grips the semiconductor die, the tool column 67 is lowered and a cutting tool 68 cuts the fourth supporting beam 24 to sever the semiconductor element from the supporting grid 25. The pick-up tool 66 is moved to carry the semiconductor element 12 from the transfer location to the bonding location.

The pick-up tool 66 places the semiconductor element 12 at the bonding location with portions of supporting beams 21, 22, 23, and 24 in contact with conductive regions 31, 32, 33, and 34, respectively, of the mounting header at the bonding location as illustrated in FIG. 15. While the pick-up tool 66 holds the semiconductor element in proper position, the bonding tools 71, 72, 73, and 74 are lowered and the supporting beams are bonded to the mating conductive regions of the header. The bonds may be made simultaneously, or one bond may be completed, the pick-up tool 66 retracted, and then the remaining bonds made simultaneously or successively.

The procedure of moving the arrays predetermined distances, transferring a semiconductor element of the array from the transfer location to the mounting header at the bonding location, and bonding the semiconductor element to the header is repeated continually to produce an array of mounted semiconductor elements as illustrated in FIG. 9. The headers and bonded semiconductor elements may then be further processed in the manner described previously in order to produce discrete semiconductor devices as illustrated in FIG. 12.

In the method of producing semiconductor devices according to the invention semiconductor elements and mounting headers are each provided in an array with a fixed relationship between units whereby each array may be produced, oriented, and manipulated as a batch. Although in the arrays shown the units are set out in rows and columns, other patterns are possible. In particular, it might be desirable for the headers in the array to be arranged in a single row.

In practicing the invention, semiconductor elements are bonded to the headers without disrupting units from predetermined relationships with other units. During operations subsequent to bonding, the headers and mounted semiconductor elements may continue to be handled in batch until completion of the encapsulated devices since known fixed relationships are maintained between the units of each group. Thus, the handling, orienting, and manipulating of extremely small individual parts is avoided and a method which is amenable to automatic or semi-automatic operation is provided.

In the foregoing description the method of the invention was employed in producing discrete semiconductor transistors having three electrically active regions. Obviously the method may also be employed in the production of other semiconductor devices, such as, for example, diodes and integrated circuit networks. Furthermore, each mounting header may include an arrangement of conductive regions to accommodate two or more semiconductor elements and also other components. That is, the array of mounting headers could be an array of circuit boards and the method of the invention could be employed to attach one or more types of semiconductor elements to each circuit.

While there has been shown and described what are considered preferred embodiments of the present invention, it will be obvious to those skilled in the art that various changes and modifications may be made therein without departing from the invention as defined in the appended claims.

What is claimed is:

1. The method of producing semiconductor devices including the steps of providing an array of semiconductor elements comprising a plurality of semiconductor elements, each semiconductor element including a body of semiconductor material and a plurality of supporting beams projecting from the body, and a supporting grid, one of the supporting beams of each semiconductor element being fixed to the supporting grid to position the semiconductor elements in a predetermined pattern, providing an array of mounting headers comprising a member of non-conductive material having a plurality of groups of conductive regions thereon, each group of regions being arranged to provide the conductive portions of a mounting header for a semiconductor element, the groups of conductive regions being arranged on the member of non-conductive material in a predetermined pattern, moving the array of mounting headers to position one of the groups of conductive regions at a bonding location with the conductive regions of the group oriented in a predetermined manner, moving the array of semiconductor elements to position one of the semiconductor elements at a transfer location with the supporting beams oriented in a predetermined manner, moving the semiconductor element at the transfer location with respect to the group of conductive regions at the bonding location to place supporting beams of said semiconductor element in contact with conductive regions of said group, and bonding supporting beams of said semiconductor element to the contacted conductive regions of said group.

2. The method of producing semiconductor devices according to claim 1 including the subsequent steps of moving the array of mounting headers a predetermined distance to position a second of the groups of conductive regions at the bonding location with the conductive regions of the group oriented in a predetermined manner, thereby moving said one of the groups of conductive regions together with the attached one of the semiconductor elements with respect to the array of semiconductor elements out of said bonding location, moving the array of semiconductor elements a predetermined distance to position a second of the semiconductor elements at the transfer location with the supporting beams oriented in a predetermined manner, moving the semiconductor element at the transfer location with respect to the group of conductive regions at the bonding location to place supporting beams of the said semiconductor element in contact with conductive regions of said group, bonding supporting beams of said second semiconductor element to the contacted conductive regions of said second group, and continuing the steps of moving the array of mounting headers a predetermined distance, moving the array of semiconductor elements a predetermined distance, moving the semiconductor element at the transfer location to place supporting beams of the semiconductor element in contact with conductive regions of the group of conductive regions at the bonding location, and bonding supporting beams of the semiconductor element to the contacted conductive regions of the group to produce an array of mounted semiconductor elements arranged in a predetermined pattern.

3. The method of producing semiconductor devices including the steps of providing a two-dimensional array of semiconductor elements comprising a plurality of substantially identical semiconductor elements, each semiconductor element including a body of semiconductor material and a plurality of conductive supporting beams projecting from the body, and a supporting grid, one of the supporting beams of each semiconductor element being fixed to the supporting grid to support the semiconductor elements and position them in a regular two-dimensional pattern, providing a two-dimensional array of mounting headers comprising a board of non-conductive material having a pluraliy of substantially identical groups of conductive regions on a flat surface thereof, the conductive regions of each group having portions adapted to mate with portions of respective supporting beams of a semiconductor element, the groups of conductive regions being arranged on the surface of the board in a regular two-dimensional pattern, moving the array of mounting headers to position one of the groups of conductive regions at a bonding location with the conductive regions of the group oriented in a predetermined manner, moving the array of semiconductor elements to position one of the semiconductor elements adjacent said one of the groups of conductive regions with portions of supporting beams of the semiconductor element in registration with respective portions of conductive regions of said one of the groups, moving the one semiconductor element toward the one group of conductive regions to place portions of supporting beams of the one semiconductor element in contact with respective portions of conductive regions of the one group, and bonding portions of the supporting beams of the semiconductor element to contacted portions of the conductive regions of the group.

4. The method of producing semiconductor devices according to claim 3 including the subsequent steps of cutting the one of the supporting beams of said one semiconductor element fixed to the supporting grid thereby severing the one semiconductor element from the array of semiconductor elements, moving the array of mounting headers a predetermined distance to position a second of the groups of conductive regions at the bonding location, thereby moving said one of the groups of conductive regions together with the attached one of the semiconductor elements with respect to the array of semiconductor elements out of said bonding location, moving the array of semiconductor elements a predetermined distance to position a second of the semiconductor elements adjacent said second of the groups of conductive regions with portions of supporting beams of the second semiconductor element in registration with respective portions of conductive regions of said second of the groups, moving the second semiconductor element toward the second group of conductive regions to place portions of supporting beams of the second semiconductor element in contact with respective portions of conductive regions of the second group, bonding portions of the supporting beams of the semiconductor element to contacted portions of the conductive regions of the group, cutting the one of the supporting beams of said second semiconductor element fixed to the supporting grid thereby severing the second semiconductor element from the array of semiconductor elements, and continuing the steps of moving the array of mounting headers a predetermined distance to position a group of conductive regions at the bonding location, moving the array of semiconductor elements a predetermined distance to position a semiconductor element adjacent the group of conductive regions at the bonding location, moving the semiconductor element toward the group of conductive regions at the bonding location to place portions of supporting beams of the semiconductor element in contact with respective portions of conductive regions of the group at the bonding location, bonding portions of the supporting beams of the semiconductor element to contacted portions of the conductive regions of the group of conductive regions at the bonding location, and cutting the one of the supporting beams of the bonded semiconductor element fixed to the supporting grid thereby severing the bonded semiconductor element from the array of semiconductor elements to produce an array of mounted semiconductor elements arranged in a regular two-dimensional pattern.

5. The method of producing semiconductor devices according to claim 4 in which the step of providing a two-dimensional array of semiconductor elements comprises forming an adherent supporting beam network of conductive material on a surface of a wafer of semiconductor material having a plurality of substantially identical groups of regions of opposite conductivity types arranged in a regular pattern at said surface, said supporting beam network including a supporting grid structure and a substantially identical group of supporting beams at each of the plurality of groups of regions of opposite conductivity types, supporting beams of each group making electrical contact to said regions of opposite conductivity types, and one of the supporting beams of said group being fixed to the supporting grid structure, and removing the semiconductor material of the wafer adherent to the supporting grid structure and to portions of the supporting beams to leave a plurality of bodies of semiconductor material, each body including a group of regions of opposite conductivity types and each body having the supporting beams of the group of supporting beams at the group of regions of opposite conductivity types projecting therefrom.

6. The method of producing semiconductor devices according to claim 4 including the subsequent step of separating the board of non-conductive material into a plurality of discrete mounting headers each including a group of conductive regions having a semiconductor element bonded thereto.

7. The method of producing semiconductor devices according to claim 3 wherein the one of the supporting beams of each semiconductor element fixed to the supporting grid to support the semiconductor elements has a region of reduced cross-sectional area, wherein the step of bonding portions of the supporting beams of the semiconductor element to contacted portions of the conductive regions of the group at the bonding location includes bonding the one of the supporting beams fixed to the supporting grid to a conductive region of the group at a point intermediate the body of semiconductor material and the region of reduced cross-sectional area, and including the subsequent steps of moving the array of mounting headers and moving the array of semiconductor elements to rupture the one of the supporting beams of said one semiconductor element fixed to the supporting grid in the region of reduced cross-sectional area thereby severing the one semiconductor element from the array, the array of mounting headers being moved a predetermined distance to position a second of the groups of conductive regions at the bonding location and the array of semiconductor elements being moved a predetermined distance to position a second of the semiconductor elements adjacent said second of the groups of conductive regions with portions of supporting beams of the semiconductor element in registration with respective portions of conductive regions of said second of the groups, moving the second semiconductor element toward the second group of conductive regions to place portions of supporting beams of the second semiconductor element in contact with respective portions of conductive regions of the second group, bonding the portions of the supporting beams of the semiconductor element to the contacted portions of the conductive regions of the group, and continuing the steps of moving the array of mounting headers a predetermined distance to position a group of conductive regions at the bonding location and moving the array of semiconductor elements a predetermined distance to position a semiconductor element adjacent the group of conductive regions at the bonding location, moving the semiconductor element toward the group of conductive regions at the bonding location to place portions of supporting beams of the semiconductor element in contact with respective portions of conductive regions of the group at the bonding location, and bonding the portions of the supporting beams of the semiconductor element to the contacted portions of the conductive regions of the group of conductive regions at the bonding location to produce an array of mounted semiconductor elements arranged in a regular two-dimensional pattern.

8. The method of producing semiconductor devices according to claim 7 in which the step of providing a two-dimensional array of semiconductor elements comprises forming an adherent supporting beam network of conductive material on a surface of a wafer of semiconductor material having a plurality of substantially identical groups of regions of opposite conductivity types arranged in a regular pattern at said surface, said supporting beam network including a supporting grid structure and a substantially identical group of supporting beams at each of the plurality of groups of regions of opposite conductivity types, supporting beams of each group making electrical contact to said regions of opposite conductivity types, and one of the supporting beams of said group being fixed to the supporting grid structure, and removing the semiconductor material of the wafer adherent to the supporting grid structure and to portions of the supporting beams to leave a plurality of bodies of semiconductor material, each body including a group of regions of opposite conductivity types and each body having the supporting beams of the group of supporting beams at the group of regions of opposite conductivity types projecting therefrom.

9. The method of producing semiconductor devices according to claim 7 including the subsequent step of separating the board of non-conductive material into a plurality of discrete mounting headers each including a group of conductive regions having a semiconductor element bonded thereto.

10. The method of producing semiconductor devices including the steps of providing a two-dimensional array of semiconductor elements comprising a plurality of substantially identical semiconductor elements, each semiconductor element including a body of semiconductor material and a plurality of conductive supporting beams projecting from the body, and a supporting grid, one of the supporting beams of each semiconductor element being fixed to the supporting grid to support the semiconductor elements and position them in a regular two-dimensional pattern, providing a two-dimensional array of mounting headers comprising a board of non-conductive material having a plurality of substantially identical groups of conductive regions on a flat surface thereof, the conductive regions of each group having portions adapted to mate with portions of respective supporting beams of a semiconductor element, the groups of conductive regions being arranged on the surface of the board in a regular two-dimensional pattern, moving the array of mounting headers to position one of the groups of conductive regions at a bonding location with the conductive regions of the group oriented in a predetermined manner, moving the array of semiconductor elements to position one of the semiconductor elements at a transfer location with the supporting beams oriented in a predetermined manner, cutting the one of the supporting beams of said one semiconductor element fixed to the supporting grid thereby severing the one semiconductor element from the array of semiconductor elements, transferring the one semiconductor element from said transfer location to the one of the groups of conductive regions at the bonding location to place portions of supporting beams of the one semiconductor element in contact with respective portions of conductive regions of the one group, and bonding portions of the supporting beams of the semiconductor element to contacted portions of the conductive regions of the group.

11. The method of producing semiconductor devices according to claim 10 including the subsequent steps of moving the array of mounting headers a predetermined distance to position a second of the groups of conductive regions at the bonding location with the conductive regions of the group oriented in a predetermined manner, moving the array of semiconductor elements a predetermined distance to position a second of the semiconductor elements at the transfer location with the supporting beams oriented in a predetermined manner, cutting the one of the supporting beams of said second semiconductor element fixed to the supporting grid thereby severing the second semiconductor element from the array of semiconductor elements, transferring the second semiconductor element from said transfer location to the second of the groups of conductive regions at the bonding location to place portions of supporting beams of the second semiconductor element in contact with respective portions of conductive regions of the second group, bonding portions of the supporting beams of the semiconductor element to contacted portions of the conductive regions of the group, and continuing the steps of moving the array of mounting headers a predetermined distance to position a group of conductive regions at the bonding location, moving the array of semiconductor elements a predetermined distance to position a semiconductor element at the transfer location, cutting the one of the supporting beams of the semiconductor element fixed to the supporting grid, transferring the severed semiconductor element from the transfer location to the group of conductive regions at the bonding location to place portions of supporting beams of the semiconductor element in contact with respective portions of conductive regions of the group, and bonding portions of the supporting beams of the semiconductor element to contacted portions of the conductive regions of the group to produce an array of mounted semiconductor elements arranged in a regular two-dimensional pattern.

12. The method of producing semiconductor devices according to claim 11 in which the step of providing a two-dimensional array of semiconductor elements comprises forming an adherent supporting beam network of conductive material on a surface of a wafer of semiconductor material having a plurality of substantially identical groups of regions of opposite conductivity types arranged in a regular pattern at said surface, said supporting beam network including a supporting grid structure and a substantially identical group of supporting beams at each of the plurality of groups of regions of opposite conductivity types, supporting beams of each group making electrical contact to said regions of opposite conductivity types, and one of the supporting beams of said group being fixed to the supporting grid structure, and removing the semiconductor material of the wafer adherent to the supporting grid structure and to portions of the supporting beams to leave a plurality of bodies of semiconductor material, each body including a group of regions of opposite conductivity types and each body having the supporting beams of the group of supporting beams at the group of regions of opposite conductivity types projecting therefrom.

13. The method of producing semiconductor devices according to claim 11 including the subsequent step of separating the board of non-conductive material into a plurality of discrete mounting headers each including a group of conductive regions having a semiconductor element bonded thereto.

References Cited

UNITED STATES PATENTS

| | | | |
|---|---|---|---|
| 3,281,628 | 10/1966 | Bauer et al. ------ | 29—588 X |
| 3,325,586 | 6/1967 | Suddick ------------ | 174—52 |
| 3,341,649 | 9/1967 | James ------------ | 29—588 X |

WILLIAM I. BROOKS, *Primary Examiner.*